United States Patent
Kudou

(10) Patent No.: US 8,791,002 B2
(45) Date of Patent: Jul. 29, 2014

(54) SEMICONDUCTOR DEVICE AND FABRICATION METHOD FOR THE SAME

(75) Inventor: Chiaki Kudou, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/820,445

(22) PCT Filed: Sep. 3, 2012

(86) PCT No.: PCT/JP2012/005568
§ 371 (c)(1),
(2), (4) Date: Mar. 1, 2013

(87) PCT Pub. No.: WO2013/076890
PCT Pub. Date: May 30, 2013

(65) Prior Publication Data
US 2013/0175548 A1    Jul. 11, 2013

(30) Foreign Application Priority Data

Nov. 21, 2011    (JP) .................................. 2011-254060

(51) Int. Cl.
H01L 21/3205    (2006.01)
H01L 29/78    (2006.01)

(52) U.S. Cl.
USPC .......................................... 438/589; 257/333

(58) Field of Classification Search
USPC ................................. 438/259, 270, 579, 589;
257/E29.134–E29.161, 283, 333
See application file for complete search history.

(56) References Cited

U.S. PATENT DOCUMENTS

| | | | |
|---|---|---|---|
| 5,494,854 A | 2/1996 | Jain | |
| 5,621,241 A | 4/1997 | Jain | |
| 5,915,180 A * | 6/1999 | Hara et al. | 257/330 |
| 6,455,378 B1 | 9/2002 | Inagawa et al. | |
| 6,469,345 B2 * | 10/2002 | Aoki et al. | 257/330 |
| 2001/0008291 A1 | 7/2001 | Aoki et al. | |
| 2001/0036705 A1 * | 11/2001 | Nishida et al. | 438/296 |
| 2002/0167046 A1 | 11/2002 | Aoki et al. | |
| 2005/0090060 A1 | 4/2005 | Aoki et al. | |

(Continued)

FOREIGN PATENT DOCUMENTS

CN    101299436 A    11/2008
CN    102194694 A    9/2011

(Continued)

OTHER PUBLICATIONS

Written Opinion of the International Searching Authority International Application No. PCT/JP2012/005568 with mailing date of Apr. 12, 2012.

*Primary Examiner* — Calvin Lee
(74) *Attorney, Agent, or Firm* — McDermott Will & Emery LLP

(57) ABSTRACT

A fabrication method for a semiconductor device includes the step of forming a gate insulating film on the side of a trench, the bottom thereof, and the periphery thereof. The step of forming a gate insulating film includes a step of forming a first insulating film on the side of the trench and a step of forming a second insulating film on the bottom and periphery of the trench using a high-density plasma chemical vapor deposition method. The thickness of the portions of the gate insulating film formed on the bottom and periphery of the trench is made larger than that of the portion of the gate insulating film formed on the side of the trench.

18 Claims, 17 Drawing Sheets

(56) References Cited

U.S. PATENT DOCUMENTS

| | | |
|---|---|---|
| 2008/0035990 A1 | 2/2008 | Matsuura et al. |
| 2008/0265289 A1 | 10/2008 | Bhalla et al. |
| 2009/0166731 A1 | 7/2009 | Maruoka |
| 2010/0193862 A1 | 8/2010 | Kanazawa |

FOREIGN PATENT DOCUMENTS

| | | |
|---|---|---|
| JP | 07-326755 | 12/1995 |
| JP | 08-069999 | 3/1996 |
| JP | 09-260663 | 10/1997 |
| JP | 11-266015 | 9/1999 |
| JP | 2000-150634 | 5/2000 |
| JP | 2001-127072 | 5/2001 |
| JP | 2001-196587 | 7/2001 |
| JP | 2007-43208 | 2/2007 |
| JP | 2007-242943 | 9/2007 |
| JP | 2007-281512 | 10/2007 |
| JP | 2008-042056 | 2/2008 |
| JP | 2009-158717 | 7/2009 |
| JP | 2010-182857 | 8/2010 |
| TW | 200843113 A | 11/2008 |

* cited by examiner (a)

(b)

(c)

SEMICONDUCTOR DEVICE AND FABRICATION METHOD FOR THE SAME

RELATED APPLICATIONS

This application is the U.S. National Phase under 35 U.S.C. §371 of International Application No. PCT/JP2012/005568, filed on Sep. 3, 2012, which in turn claims the benefit of Japanese Application No. 2011-254060, filed on Nov. 21, 2011, the disclosures of which Applications are incorporated by reference herein.

TECHNICAL FIELD

The present disclosure relates to a semiconductor device and a fabrication method for the same, and more particularly to a semiconductor device having a trench gate structure and a fabrication method for the same.

BACKGROUND ART

In recent years, semiconductor devices having a trench gate structure have attracted attention. While a channel is formed on the surface of a semiconductor layer in semiconductor devices having a planar gate structure, a channel region is formed on the side of a trench provided in a semiconductor layer in the semiconductor devices having the trench gate structure. The trench gate structure semiconductor devices are therefore more expected to achieve miniaturization and reduction in ON resistance than the planar gate structure semiconductor devices. For this reason, in the field of power devices, in particular, development of trench gate structure semiconductor devices is underway.

The trench gate structure semiconductor devices, which are free from the limitation on miniaturization caused by the junction FET (JFET) effect, have an advantage that a fine trench can be formed to permit reduction in ON resistance and switching loss. However, a problem arises that the aspect ratio of a fine trench is large, making it difficult to embed a gate electrode in such a trench. Also, since the cross-sectional area of the gate electrode decreases, the gate resistance will increase. To prevent or reduce the increase in gate resistance, it is being examined to form a gate electrode in a T shape to extend the gate electrode over the periphery of the trench (see Patent Document 1, for example).

Also, in the trench gate structure semiconductor devices, it is important to form a suitable gate insulating film inside the trench. An electric field is concentrated on the bottom of the trench, where the field strength is higher than in any other portion. Therefore, there is the possibility that a breakdown due to a dielectric breakdown of the gate insulating film may occur at the bottom of the trench.

If the gate insulating film is thickened as a whole to increase the dielectric breakdown field, the threshold voltage at switching will increase. Therefore, a method of forming a thicker gate insulating film on the bottom of the trench using a difference in plane direction between the side and bottom surfaces of the trench is being examined (see Patent Document 2, for example). Also being examined is a method where a mask is formed on the side of the trench during formation of the gate insulating film to form a thick gate insulating film on the bottom of the trench while preventing or reducing formation of an oxide film on the side of the trench (see Patent Document 3, for example).

CITATION LIST

Patent Document

PATENT DOCUMENT 1: Japanese Patent Publication No. 2007-281512
PATENT DOCUMENT 2: Japanese Patent Publication No. H07-326755
PATENT DOCUMENT 3: Japanese Patent Publication No. 2007-242943

SUMMARY OF THE INVENTION

Technical Problem

However, the conventional trench gate structure semiconductor devices described above have the following problems. First, in the case of controlling the thickness of the gate insulating film using the plane direction of the substrate, a substrate having a special plane direction is necessary, and this increases the fabrication cost. Also, it is not possible to set the film thickness on the side of the trench and that on the bottom thereof to arbitrary values independently.

In the case of forming a mask on the side of the trench to form a thick gate insulating film only on the bottom of the trench, steps of forming and removing the mask are necessary. This complicates the fabrication process, and increases the fabrication cost and the cycle time.

In the case of forming a T-shaped gate electrode, it is necessary to form the gate insulating film also on the portion of the semiconductor layer surrounding the trench. If the gate insulating film formed on the periphery of the trench is thin, the gate-source capacitance will increase, causing a delay. In formation of a T-shaped gate electrode, therefore, it is necessary to control not only the thickness of the portions of the gate insulating film on the side and bottom of the trench, but also the thickness of the portion thereof on the periphery of the trench.

Moreover, if a thick gate insulating film is formed on the periphery of the trench, the trench will become virtually deep, increasing the aspect ratio. This raises a problem of making it difficult to embed the gate electrode in the trench.

The problems described above occur commonly in silicon semiconductor devices and in semiconductor devices using a wide band-gap semiconductor such as silicon carbide (SiC). The relative permittivity of SiC (9.7 for 4H—SiC) is smaller than that of Si (11.9), and the difference thereof from that of $SiO_2$ (3.8) is small. Therefore, in a semiconductor device using SiC, a larger electric field is applied to the gate insulating film, causing a larger problem.

According to an embodiment disclosed in this specification, a semiconductor device is provided where control of the thickness of the gate insulating film inside the trench and on the periphery of the trench is easy and also embedding of the gate electrode into the trench is facilitated.

Solution to the Problem

One form of the fabrication method for a semiconductor device disclosed in this specification includes the steps of preparing a substrate having a semiconductor layer provided on a principal surface; forming a trench in the semiconductor layer; forming a gate insulating film on a side of the trench, a bottom of the trench, and a periphery of the trench; and forming a conductive film on the gate insulating film to fill the trench and extend on the periphery of the trench. The step of forming a gate insulating film includes a step of forming a first insulating film on the side of the trench and a step of forming a second insulating film on the bottom of the trench and the periphery of the trench using a high-density plasma chemical vapor deposition method, the thickness of portions of the gate insulating film formed on the bottom of the trench and the periphery of the trench being made larger than that of a portion of the gate insulating film formed on the side of the trench. In the step of forming a conductive film, the conductive film is formed to be in contact with a portion of the first insulating film formed on the side of the trench.

One form of the semiconductor device disclosed in this specification includes: a substrate; a semiconductor layer provided on a principal surface of the substrate; a trench provided in the semiconductor layer; a gate insulating film provided on a side of the trench, a bottom of the trench, and a periphery of the trench; and a conductive film provided on the gate insulating film to fill the trench and extend on the periphery of the trench, wherein the gate insulating film has a first insulating film provided on the side of the trench and a second insulating film provided on the bottom of the trench and the periphery of the trench, the thickness of portions of the gate insulating film provided on the bottom of the trench and the periphery of the trench is larger than that of a portion of the gate insulating film provided on the side of the trench, a portion of the second insulating film provided on the periphery of the trench has an inclined portion that becomes gradually thicker from the trench-side end, and the inclination angle of the inclined portion with respect to the principal surface of the substrate is 45±5 degrees, and the conductive film is in contact with a portion of the first insulating film formed on the side of the trench.

Advantages of the Invention

According to an embodiment disclosed in this specification, it is possible to implement a semiconductor device where control of the thickness of the gate insulating film inside the trench and on the periphery of the trench is easy and also embedding of the gate electrode into the trench is facilitated.

DESCRIPTION OF EMBODIMENTS

In the fabrication method for a semiconductor device disclosed in this specification, a gate insulating film is formed by a combination of a high-density plasma chemical vapor deposition (HDP-CVD) method and a thermal oxidation method, for example.

According to the above fabrication method, it is possible to freely set the thickness of a gate insulating film on the bottom and periphery of a trench and the thickness of a gate insulating film on the side of the trench independently without complicating the process. It is also possible to easily implement a semiconductor device that can prevent or reduce occurrence of dielectric breakdown of the gate insulating film on the bottom of a trench with little influence exerted on properties such as the threshold voltage. Moreover, it is possible to implement a semiconductor device that can achieve both reduction in gate resistance and reduction in gate capacitance and is excellent in high frequency operation.

Figure 1:
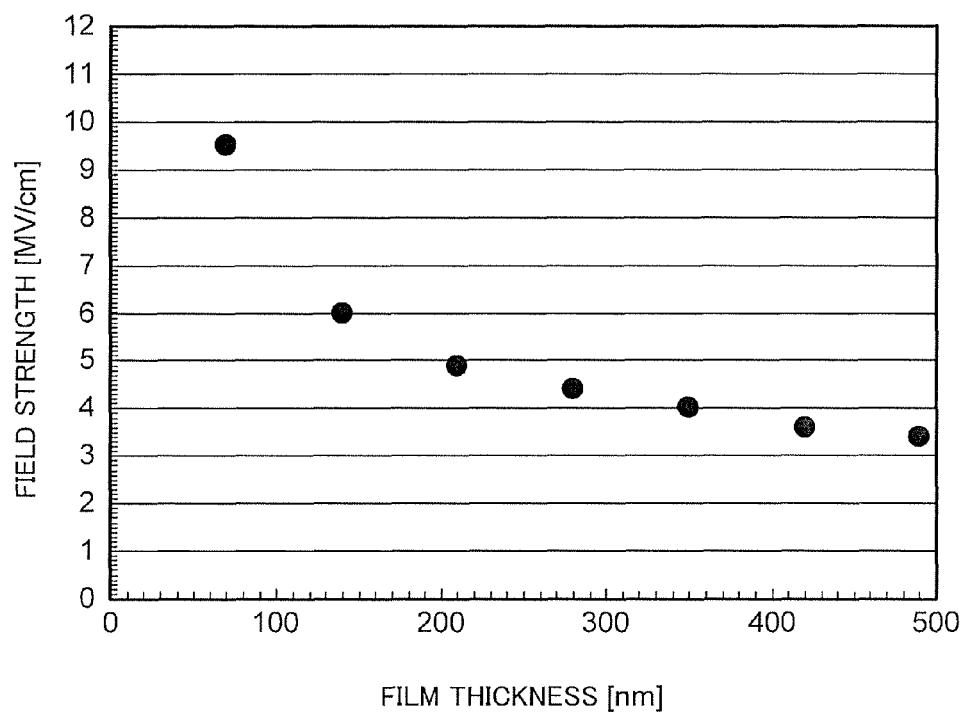
FIG. 1 is a graph showing the relationship between the thickness of an insulating film formed on the bottom of a trench and the field strength exerted on the insulating film at the bottom of the trench.

First, the required thickness of the gate insulating film will be described. FIG. 1 shows the results, obtained by simulation, of the field strength exerted on the trench bottom in a trench gate structure semiconductor device using 4H—SiC. The drain voltage was set to 1200 V and the junction breakdown voltage between a drift region and a body region to 1200 V or more. The field strength exerted on the trench bottom when the thickness of the gate insulating film on the trench bottom was varied while the thickness thereof in a channel region on the trench side was fixed to 70 nm was obtained.

As shown in FIG. 1, when the thickness of the gate insulating film on the trench bottom is 70 nm, which is the same as that on the trench side, the field strength exceeds 9 MV/cm. Even when the film thickness on the trench bottom is 140 nm, which is twice as large as that on the trench side, a field strength of 6 MV/cm is exerted on the trench bottom.

The dielectric breakdown field strength of a normal thermally-oxidized film is 10 mV/cm or more. However, to ensure the reliability in long-term use, it is preferable to set the field strength allowable for a semiconductor device to on the order of 3 MV/cm to 4 MV/cm, which is sufficiently smaller than the dielectric breakdown field strength.

As shown in FIG. 1, by setting the thickness of the gate insulating film on the trench bottom to 350 nm or more, which is five times or more as large as the thickness of the gate insulating film on the trench side, the field strength exerted on the trench bottom becomes 4 MV/cm or less.

In 4H—SiC, the (000-1) C plane is a plane large in oxidation speed, but the oxidation speed thereof is only about twice as high as that of the (11-20) plane. Therefore, it is difficult to secure, as the thickness of the gate insulating film on the trench bottom, a thickness five times or more as large as that on the trench side by using the difference in oxidation speed between the plane directions. Moreover, since the combination of the plane direction of the bottom surface of the trench and the plane direction of the side surface thereof is restrictive, it is not possible to control the film thickness on the side and the film thickness on the bottom independently. Furthermore, on the C plane, low-density epitaxial growth is difficult. For these reasons, it is difficult and unpractical to reduce the electric field exerted on the trench bottom to a predetermined value or less, while securing the properties of the transistor, using the difference in oxidation speed between the plane directions.

In the case of thickening the gate insulating film on the trench bottom by forming the gate insulating film in a plurality of separate steps, it is possible to control the film thickness on the trench side and the film thickness on the trench bottom independently. However, this raises a large problem of increasing the fabrication steps. For example, the following steps will be necessary. First, after formation of a thermally-oxidized film inside the trench, a polysilicon film is formed to cover the thermally-oxidized film. Thereafter, a nitride film covering the polysilicon film is formed and then selectively removed, to form a mask covering the side of the trench and exposing the bottom thereof. After thermal oxidation of the exposed portion of the polysilicon film, the mask is removed, and further the unoxidized polysilicon film is removed.

The oxidized film obtained by oxidizing the polysilicon film is low in dielectric breakdown field strength compared with an oxidized film obtained by oxidizing single-crystalline silicon. In this case, therefore, the gate insulating film on the trench bottom must be made thicker than that in the case of directly forming a thermally-oxidized film on the trench bottom. It is however difficult to completely oxidize a thick polysilicon film down to its inside, and thus it is not easy to largely increase the thickness of the gate insulating film on the trench bottom compared with that on the trench side.

Moreover, in either of the above methods, a thick insulating film is formed on the trench bottom by thermal oxidation. The present inventors have found that, when a thermally-oxidized film having a thickness twice or more as large as that on the trench side is formed on the trench bottom, a defect tends to be introduced in the semiconductor layer. In the process of forming a thermally-oxidized film, the volume of the surface portion of the semiconductor layer increases by oxidation. Therefore, when a thick thermally-oxidized film is formed on the trench bottom, a large stress will be exerted on the corners of the trench bottom, increasing the possibility of disturbing the crystallinity at the corners. This tends to cause a defect in the semiconductor layer, resulting in the possibilities of reducing the breakdown voltage of the semiconductor device and increasing the leak current.

The present inventors have focused attention on the fact that, by using the HDP-CVD method, an $SiO_2$ film can be selectively deposited on the bottom of a trench while being little deposited on the side thereof. By using the HDP-CVD method, it is possible to control the film thickness on the side of the trench and the film thickness on the bottom thereof independently. Also, with no mask needed, the number of process steps will not largely increase. Moreover, since a dense $SiO_2$ film can be obtained using the HDP-CVD method, a large dielectric breakdown field strength can be obtained even if the thickness of this film is small compared with that of an $SiO_2$ film obtained by oxidizing polysilicon.

In the formation of an $SiO_2$ film using the HDP-CVD method, film deposition and etching occur simultaneously, to etch an edge portion. Therefore, an $SiO_2$ film formed on the periphery of the trench has an inclined portion that becomes gradually thicker from the trench side. Accordingly, even though a comparatively thick gate insulating film is formed on the periphery of the trench, an increase in the virtual aspect ratio of the trench can be prevented or reduced, and also an advantage of facilitating embedding of a gate electrode can be obtained.

Figure 2:
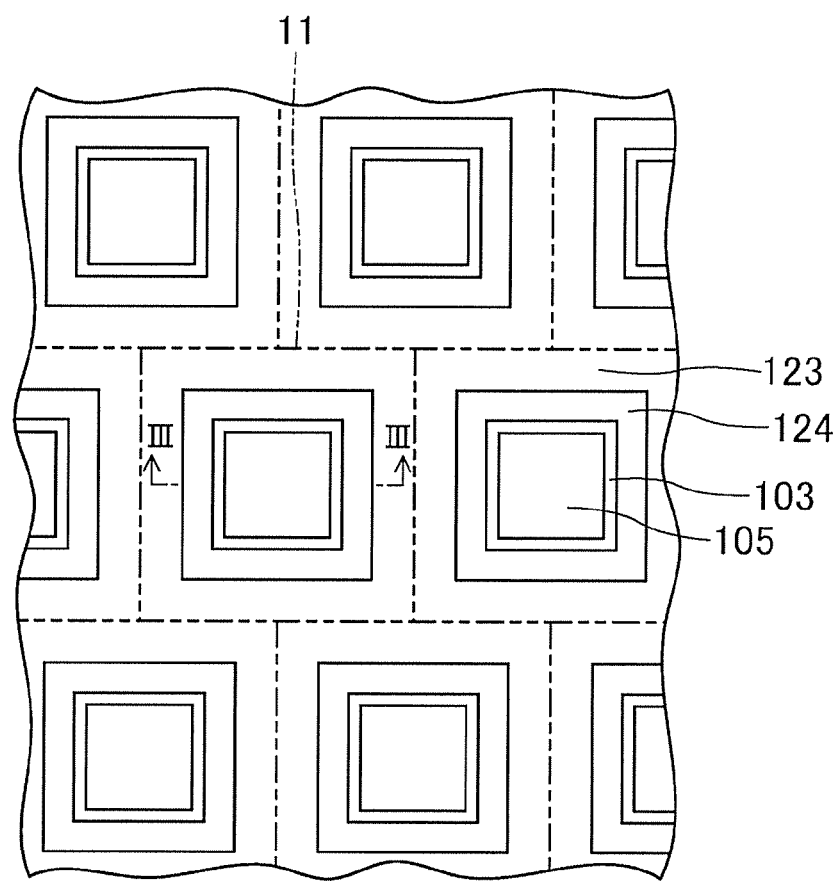
FIG. 2 is a plan view showing a semiconductor device of an embodiment.
Figure 3:
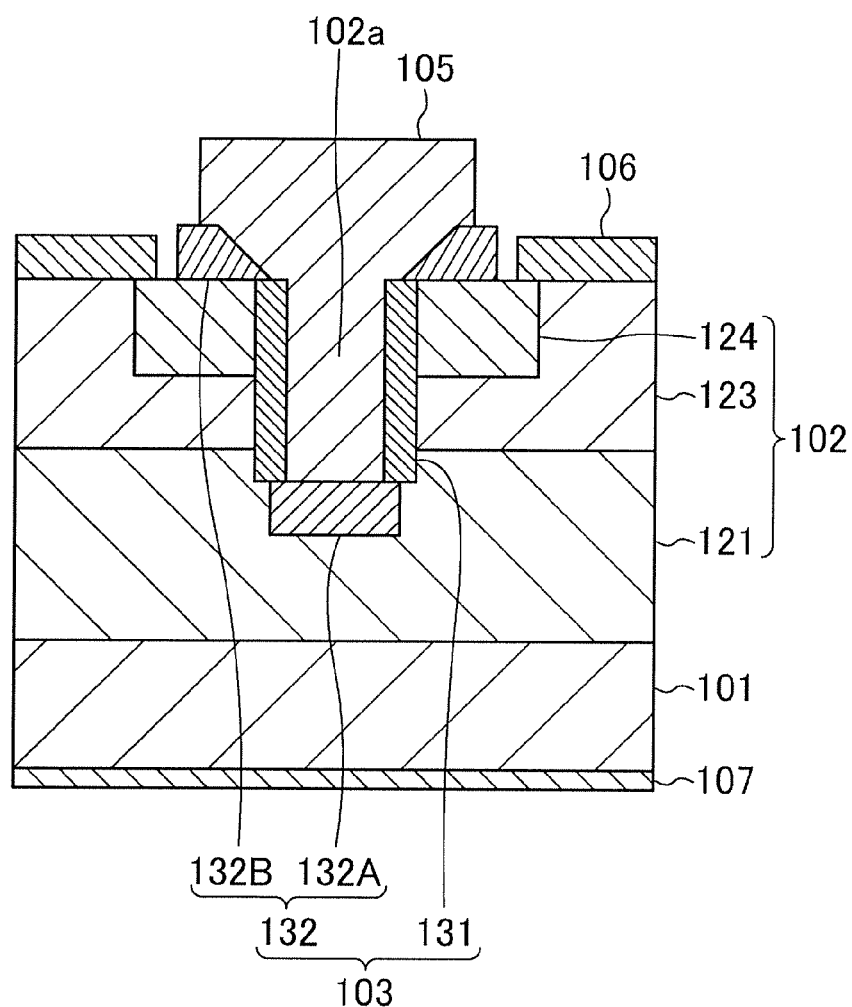
FIG. 3 is a cross-sectional view showing the semiconductor device of the embodiment.

The semiconductor device of the present disclosure will be described hereinafter by way of example. The semiconductor device of this embodiment is a SiC-metal-insulator-semiconductor field effect transistor (MISFET) having the trench gate structure, and has a plurality of unit cells 11. FIG. 2 shows a planar configuration of the unit cells 11, and FIG. 3 shows a cross-sectional configuration taken along line in FIG. 2. Note that illustration of source electrodes is omitted in FIG. 2. Each unit cell 11 has a semiconductor layer 102 provided on the surface (principal surface) of a substrate 101 including SiC. The semiconductor layer 102 has an n-type drift region 121, a p-type body region provided on the drift region 121, and an n-type source region 124 provided in a top portion of the body region 123. The source region 124 is surrounded by the body region 123.

The semiconductor layer 102 has a trench (concave) 102a extending through the source region 124 and the body region 123 to reach the drift region 121. A gate insulating film 103 is formed inside the trench 102a and on a portion of the source region 124 surrounding the trench 102a. The gate insulating film 103 includes a first insulating film 131 provided on the side of the trench 102a and a second insulating film 132 provided on the bottom of the trench 102a and the periphery of the trench 102a. The second insulating film 132 includes an inner-trench portion 132A provided on the bottom of the trench 102a and a trench-periphery portion 132B provided on a portion of the semiconductor layer 102 surrounding the trench 102a.

A gate electrode 105 made of a conductive film is embedded in the trench 102a. The gate electrode 105 is formed in a T shape in cross section extending over the periphery of the trench 102a. The bottom of the portion of the gate electrode 105 inside the trench 102a is in contact with the inner-trench portion 132A of the second insulating film 132, and the side thereof is in contact with the first insulating film 131. The portion of the gate electrode 105 located on the periphery of the trench 102a is in contact with the trench-periphery portion 132B of the second insulating film 132. Thus, the gate electrode 105 is insulated from the semiconductor layer 102 by the gate insulating film 103.

A source electrode (source-body electrode) 106 electrically connected to the source region 124 and the body region 123 is provided on the semiconductor layer 102. The source electrode 106 is formed to surround the trench 102a. A drain electrode 107 is provided on the back surface of the substrate 101. An interlayer insulating film covering the gate electrode 105 and the source electrode 106 is provided on the semiconductor layer 102 as required, and a gate interconnect and a source interconnect are provided in the interlayer insulating film. The gate interconnect and the source interconnect are respectively connected to the gate electrode 105 and the source electrode 106 via respective contact plugs.

Figure 4:
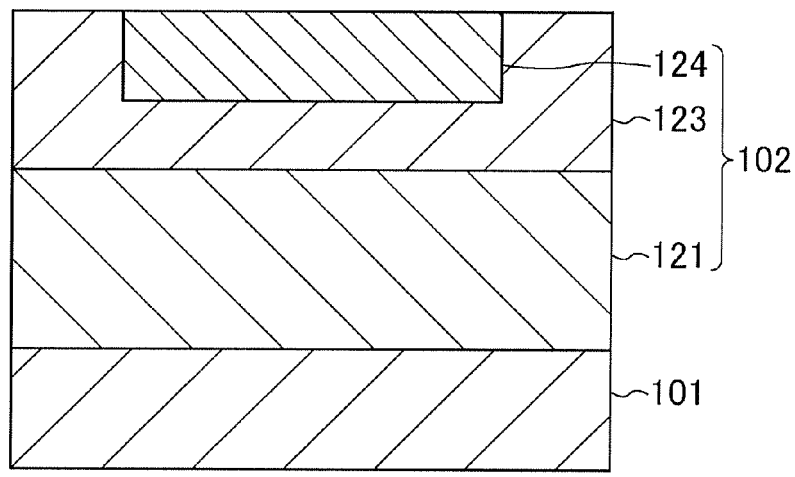
FIG. 4 is a cross-sectional view showing a fabrication process for the semiconductor device of the embodiment.

The semiconductor device of this embodiment may be fabricated in the following manner. First, as shown in FIG. 4, SiC is epitaxially grown on the principal surface of the substrate 101, to form the n-type drift region 121 and the p-type body region 123 sequentially. Subsequently, the n-type source region 124 is formed in the body region 123.

As the substrate 101, a low-resistance n-type SiC substrate containing nitrogen in a concentration of about $3\times10^{18}$ cm$^{-3}$ can be used. The drift region 121 may be doped with nitrogen in a concentration of about $8\times10^{15}$ cm$^{-3}$. The thickness of the drift region 121 may be about 12 μm. The impurity concentration and thickness of the drift region 121 are not limited to the above examples, but may be determined depending on the breakdown voltage required.

The body region 123 may be doped with aluminum in a concentration of about $2\times10^{18}$ cm$^{-3}$. The thickness of the body region 123 may be about 1 μm.

The source region 124 may be formed by ion implantation, etc. An implantation mask made of SiO$_2$, etc. may be formed so as to expose a portion of the body region 123 that is to be the source region 124, and thereafter n-type impurity ions (e.g. nitrogen ions) may be implanted in the body region 123. The ion implantation may be performed under the conditions of an accelerating energy of 100 keV and a dose of $5\times10^{15}$ cm$^{-2}$. After removal of the implantation mask, annealing may be performed at a temperature of about 1700° C. under an inert gas atmosphere for about 30 minutes. By this annealing, the implanted impurity ions are activated to provide the source region 124.

While an example of forming the semiconductor layer 102 by epitaxial growth has been described, the entirety or part of the semiconductor layer 102 may be formed by performing ion implantation, etc. for a SiC substrate. For example, a p-type impurity may be implanted in the n-type SiC substrate to use an upper portion of the SiC substrate as the body region 123. Alternatively, after epitaxial growth of an n-type semiconductor layer on a SiC substrate, p-type impurity ions may be implanted in a surface region of the grown n-type semiconductor layer, to form the body region 123. In these cases, the region having no p-type impurity implanted serves as the drift region 121.

Figure 5:
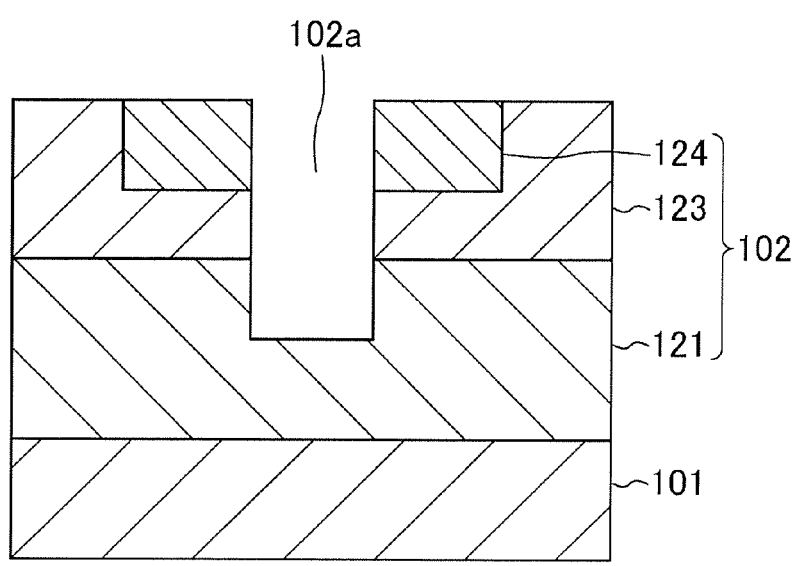
FIG. 5 is a cross-sectional view showing the fabrication process for the semiconductor device of the embodiment.

Thereafter, as shown in FIG. 5, the trench 102a is formed in the semiconductor layer 102. For example, part of the source region 124, the body region 123 and the drift region 121 may be removed by reactive ion etching (RIE) using a mask made of an SiO$_2$ film that exposes a center portion of the source region 124, to form the trench 102a. The trench 102a is formed so as not to extend through the drift region 121 and to have its bottom located below the interface between the drift region 121 and the body region 123. For example, the trench 102a may have a depth of about 1.5 μm and a width of about 1 μm. While an example of the trench 102a the side of which is vertical to the principal surface of the substrate 101 is shown in FIG. 5, the side of the trench 102a may not be necessarily vertical to the principal surface of the substrate 101.

Figure 6:
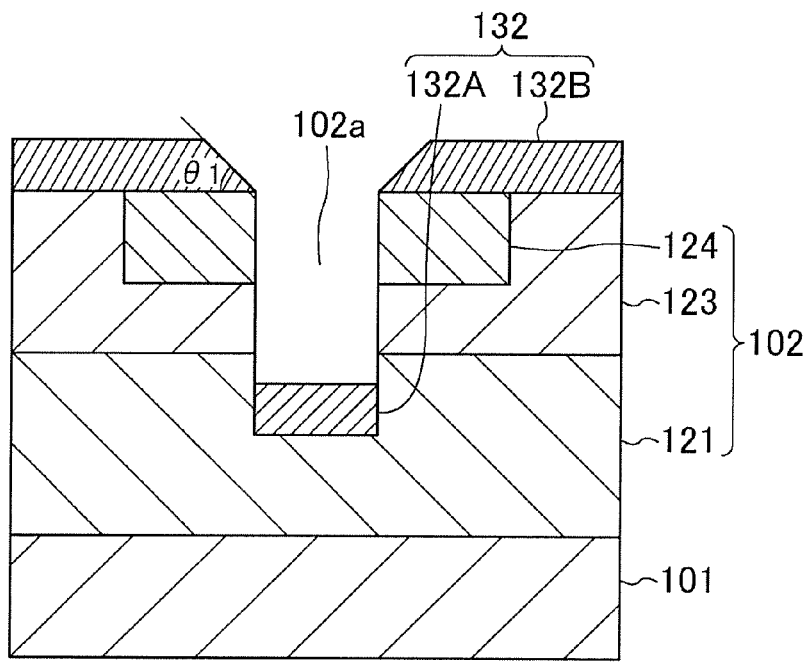
FIG. 6 is a cross-sectional view showing the fabrication process for the semiconductor device of the embodiment.

Thereafter, as shown in FIG. 6, the second insulating film 132 is deposited by the HDP-CVD method. By using the HDP-CVD method, control can be made so as to form the second insulating film 132 on the bottom of the trench 102a and the periphery thereof but not to form on the side of the trench 102a. The thickness of the inner-trench portion 132A formed on the bottom of the trench 102a and the trench-periphery portion 132B formed on the periphery of the trench 102a may be set to about 150 nm to about 500 nm. In this embodiment, the thickness of these portions is set to about 350 nm as an example. The thickness of the second insulating film 132 may be adjusted by the deposition time.

After the formation of the second insulating film 132, in order to improve the insulation property of the second insulating film 132, it is preferable to perform heat treatment at a temperature of about 900° C. under an inert gas atmosphere or an oxidation atmosphere. Such heat treatment may however be omitted.

In this embodiment, the second insulating film 132 is formed by the HDP-CVD method. The HDP-CVD method is a CVD method using high-density plasma, where the plasma density is higher than in normal plasma CVD, and has advantages such as that a good-quality film can be formed even at a low temperature. The HDP-CVD method also has a feature that, since sputter-etching and deposition are performed simultaneously, a film is little formed on a portion of the underlying layer inclined at a degree higher than about 45 degrees, and the end of a film formed gives an inclined face having an inclination angle of about 45 degrees. Therefore, as shown in FIG. 6, the second insulating film 132 is little deposited on the side of the trench 102a. Thus, the second insulating film 132 can be formed only on the bottom of the trench 102a and the periphery thereof without the necessity of forming a mask on the side of the trench 102a.

By the HDP-CVD method, even when a thick SiO$_2$ film is formed, a large stress is less likely to occur on the substrate compared with the case of forming an SiO$_2$ film by the thermal oxidation method. This method therefore provides another advantage that, even when a thick SiO$_2$ film is formed on the bottom of the trench 102a, it is possible to prevent or reduce introduction of a defect in the semiconductor layer 102.

The formation of the second insulating film 132 by the HDP-CVD method can be performed using a known apparatus under known conditions. For example, when using an HDP-CVD apparatus of a parallel plate type having top and side plasma generation coils, an SiO$_2$ film may be deposited under the following conditions. The electric power supplied to the top coil may be about 1300 W and that to the side coil about 3100 W, to apply a bias of about 3300 W to the substrate. Into the chamber having a pressure of about 6 mTorr (about 0.8 Pa), fed are argon (Ar) at about 125 sccm (sccm means ml/min at 0° C. and 1 atm.; about 0.21 Pa m$^3$/s), oxygen (O$_2$) at about 145 sccm (about 0.25 Pa m$^3$/s), and silane (SiH$_4$) at about 80 sccm (about 0.14 Pa m$^3$/s). Argon, oxygen, and silane are fed from top and from side. The feed amounts of argon, oxygen, and silane may be adjusted according to the growth rate required.

Figure 7:
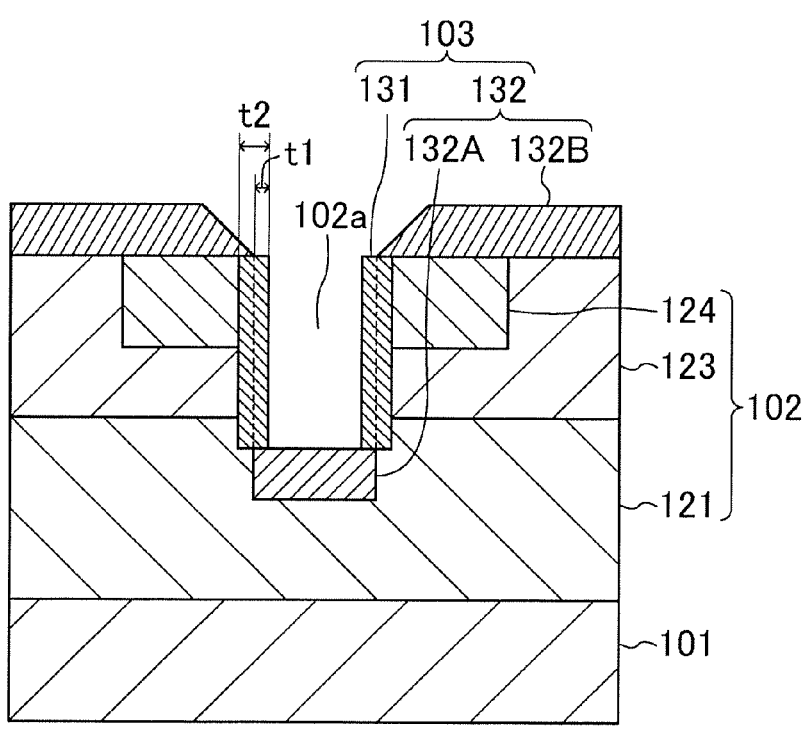
FIG. 7 is a cross-sectional view showing the fabrication process for the semiconductor device of the embodiment.

Thereafter, as shown in FIG. 7, the first insulating film 131 is formed on the side of the trench 102a. The first insulating film 131 may be made thinner than the second insulating film 132. Specifically, the thickness may be about 30 nm to about 100 nm. For example, by performing heat treatment at a temperature of about 1200° C. under a dry oxidation atmosphere for about three hours, the first insulating film 131 having a thickness of about 70 nm can be formed. During this heat treatment, also, an effect of densifying the second insulating film 132 is obtained.

In the thermal oxidation, the first insulating film 131 grows toward the semiconductor layer 102 and toward the trench 102a approximately equally. Therefore, as shown in FIG. 7, the end of the trench-periphery portion 132B of the second insulating film 132 on the trench 102a side is now located at a position somewhat receding from the top edge of the trench 102a after formation of the first insulating film 131. Theoretically, the end of the trench-periphery portion 132B is at the position of the top edge of the trench 102a before formation of the first insulating film 131. When the first insulating film 131 is grown toward the semiconductor layer 102 and toward the trench 102a approximately equally, the spacing t1 between the end of the trench-periphery portion 132B and the top edge of the trench 102a after the formation of the first insulating film 131 will be approximately equal to a half of the thickness t2 of the first insulating film 131.

Figure 8:
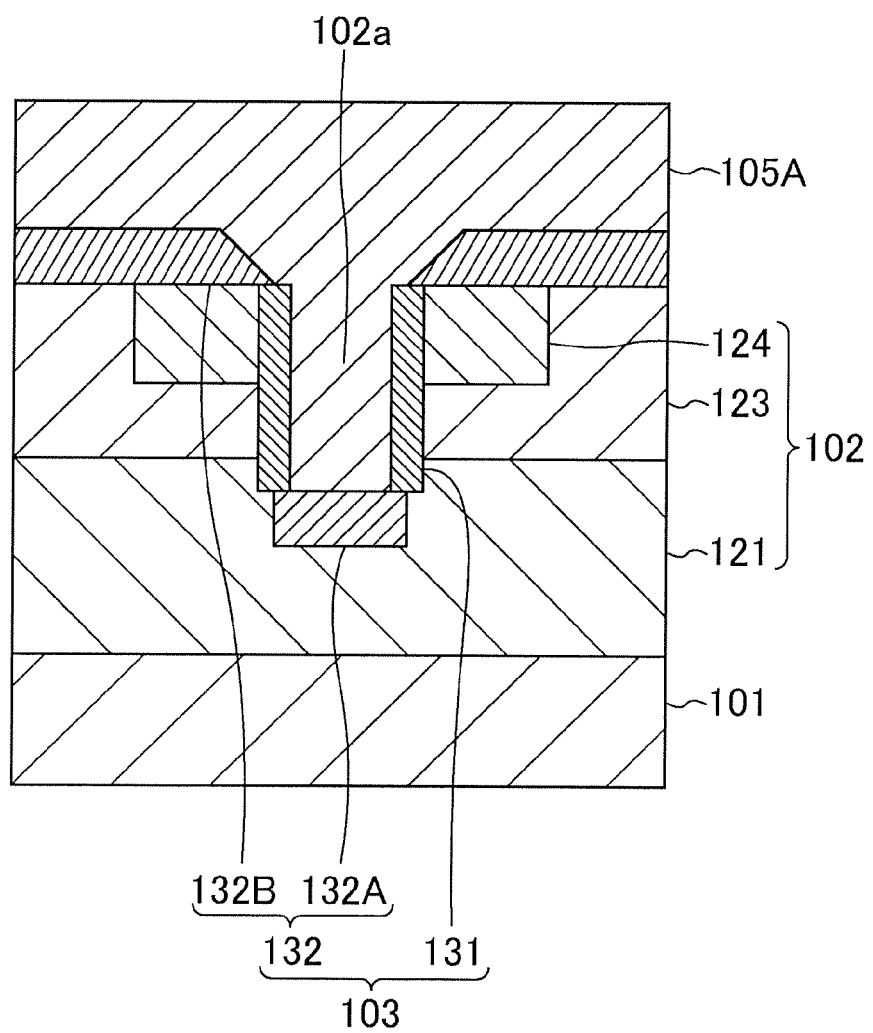
FIG. 8 is a cross-sectional view showing the fabrication process for the semiconductor device of the embodiment.

Thereafter, as shown in FIG. 8, a conductive film 105A is formed over the entire surface of the semiconductor layer 102 including the inside of the trench 102a. The conductive film 105A may be a polysilicon film having a thickness of about 600 nm doped with phosphorus in a concentration of $1 \times 10^{20}$ cm$^{-3}$ or more, for example. Such a polysilicon film may be formed by an LP-CVD method, for example. Note however that the conductive film 105A may be a conductive film other than the polysilicon film.

Figure 9:
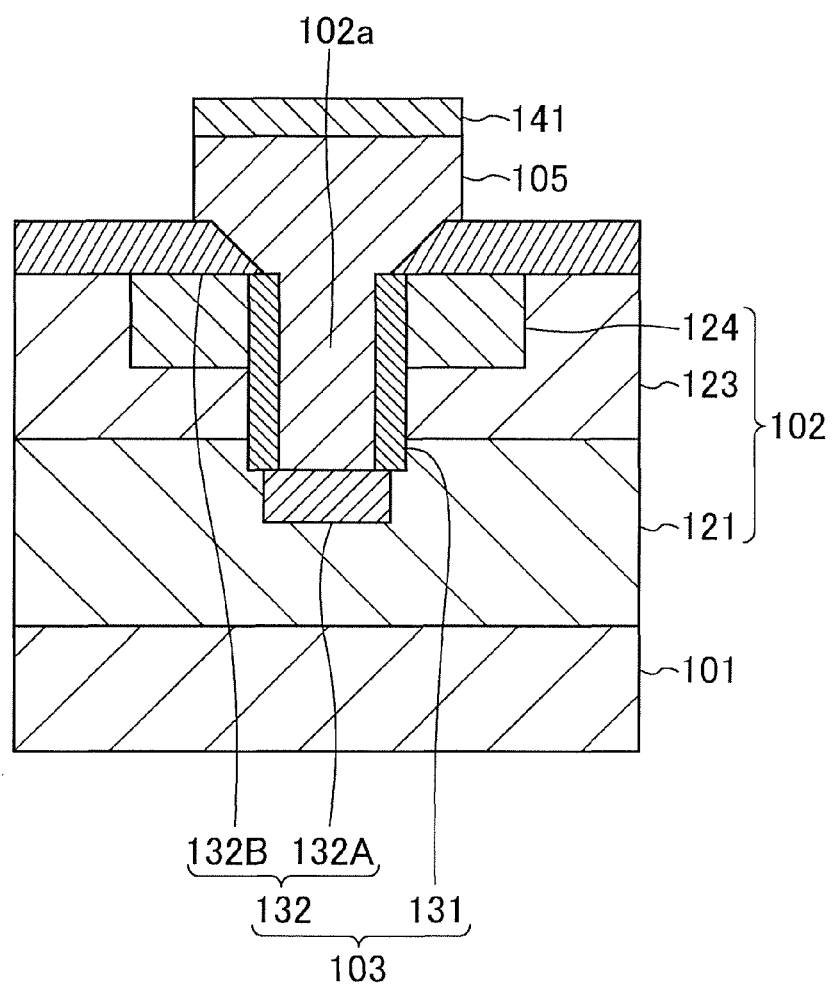
FIG. 9 is a cross-sectional view showing the fabrication process for the semiconductor device of the embodiment.

Then, as shown in FIG. 9, the conductive film 105A is etched (dry-etched) using a resist layer 141 that covers a portion above the trench 102a and exposes the other portion as a mask, to obtain the gate electrode 105 having a T-shaped cross section. It is preferable that the size of the portion of the gate electrode 105 hanging over the periphery of the trench 102s be 500 nm or more considering a misalignment, etc. in the lithography technique. Note however that the gate electrode 105 does not necessarily have a T-shaped cross section as far as the gate resistance required can be secured. Subsequently, the portion of the second insulating film 132 that is not covered by the gate electrode 105 is removed, to expose the source region 124 and the body region 123.

Figure 10:
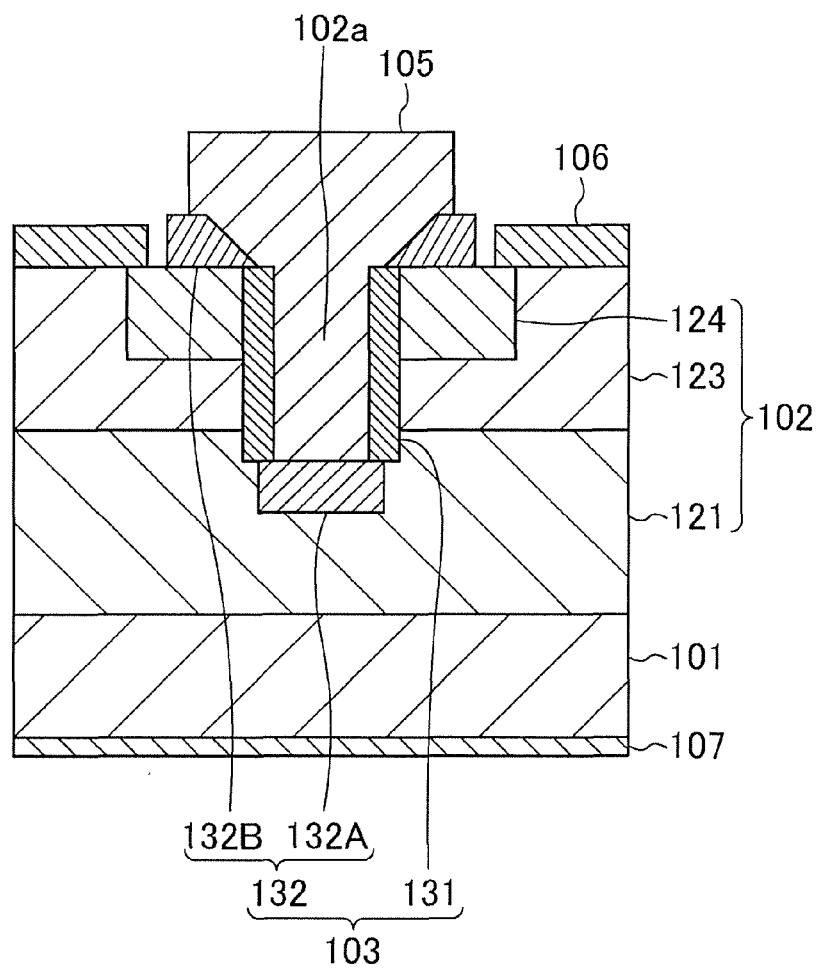
FIG. 10 is a cross-sectional view showing the fabrication process for the semiconductor device of the embodiment.

Thereafter, as shown in FIG. 10, the source electrode 106 is formed so as to be in contact with the body region 123 and the source region 124. Specifically, the source electrode 106 may be formed in the following manner. First, an insulating film that is to be an interlayer insulating film is formed to cover the semiconductor layer 102 and the gate electrode 105. Subsequently, an opening that exposes part of the body region 123 and the source region 124 is formed through the insulating film, and a conductive film is formed inside the opening. The conductive film may be a nickel (Ni) film, etc., and may be subjected to heat treatment after the formation. In this way, the source electrode that is in ohmic contact with the source region 124 and the body region 123 is obtained. Also, the drain electrode 107 is formed on the back surface (surface opposite to the principal surface) of the substrate 101. Although not shown, interconnects, plugs for connecting the electrodes with the interconnects, etc. may be formed as required.

In this embodiment, the gate insulating film 103 is formed by the HDP-CVD method and the thermal oxidation method in combination. Therefore, the thickness of the gate insulating film 103 on the side of the trench 102a and the thickness of the gate insulating film 103 on the bottom and periphery of the trench 102a can be easily set independently without the necessity of forming a mask, etc. The thicknesses of the gate insulating film 103 on the side of the trench 102a and on the bottom thereof may be set appropriately depending on the threshold voltage, the breakdown voltage, etc. required. In order to reduce the field strength exerted on the gate insulating film 103 at the bottom of the trench 102a, the film thickness on the bottom of the trench 102a may be made larger than that on the side of the trench 102a. It is more preferable to make the film thickness on the bottom of the trench 102a three times or more as large as that on the side of the trench 102a. Further, in order to reduce the field strength exerted on the bottom of the trench 102a, the film thickness may be made four to five times as large as that on the side of the trench 102a.

For example, the thickness of the gate insulating film 103 on the side of the trench 102a may be set to about 70 nm, and the thickness of the gate insulating film 103 on the bottom of the trench 102a to about 350 nm to about 400 nm. By setting the thickness of the gate insulating film 103 on the bottom of the trench 102a to about 350 nm to about 400 nm, the field strength exerted on the bottom of the trench 102a can be reduced to as small as about 4 MV/cm.

In SiC, the oxidation speed of the (0001) Si plane is very low. Therefore, if the (0001) Si plane easy in crystal growth is used as the principal surface, and the thickness of the gate insulating film 103 on the side of the trench 102a is set to about 70 nm, the thickness of an SiO$_2$ film formed on the top surface of the semiconductor layer 102 by the thermal oxidation method will be about 10 nm. Therefore, the gate electrode 105 having a T-shaped cross section will become close to the source region 124, increasing the source-gate capacitance.

By contrast, in this embodiment, the thickness of the portion of the gate insulating film 103 formed on the periphery of the trench 102a is approximately equal to that on the bottom of the trench 102a. For example, it is easy to set the thickness of the portion of the gate insulating film 103 formed on the periphery of the trench 102a to about 400 nm. This thickness is about 40 times as large as that of a film formed on the (0001) Si plane by the thermal oxidation method, and thus the gate-source capacitance can be reduced to about one-fortieth of that in the case of the thermal oxidation method. Thus, it is preferable that the thickness of the portion of the gate insulating film 103 formed on the periphery of the trench 102a be larger than that of the portion thereof formed on the side of the trench 102a because the gate-source capacitance can be reduced.

It is also preferable that the thickness of the portion of the gate insulating film 103 formed on the periphery of the trench 102a be larger than that of the portion thereof formed on the bottom of the trench 102a because the trench 102a can be made shallow. When the trench 102a can be made shallow, the time required for formation of the trench 102a can be shortened. Moreover, if the trench 102a is deep, increasing the aspect ratio that is the ratio of the depth to the width, the etching rate will become high near the bottom of the trench 102a, easily causing a shape degradation called a sub-trench. By reducing the depth of the trench 102a, therefore, occurrence of a sub-trench can be prevented or reduced.

In the HDP-CVD method, deposition is more likely to occur on the periphery of the trench than on the bottom of the trench. In particular, this effect is larger when the aspect ratio of the trench is larger. Therefore, in general, the thickness of the portion (132B) of the gate insulating film 103 formed on the periphery of the trench 102a is larger than that of the portion (132A) formed on the bottom of the trench 102a. Also, the thickness of the portion (132B) of the gate insulating film 103 formed on the periphery of the trench 102a is larger than that of the portion (131) formed on the side of the trench 102a. Note that the portion (132B) of the gate insulating film 103 formed on the periphery of the trench 102a is inclined in the neighborhood of the trench 102a: the film thickness becomes gradually larger as the position is farther from the trench 102a. It should therefore be noted that the thickness of the portion of the gate insulating film 103 formed on the periphery of the trench 102a refers to the maximum thickness of the portion formed on the periphery of the trench 102a.

Moreover, by forming the second insulating film 132 by the HDP-CVD method, the end face of the trench-periphery portion 132B formed on the periphery of the trench 102a can be made inclined with respect to the principal surface of the substrate 101 as shown in FIG. 6. The inclination angle θ1 of the inclined face is about 45 degrees in a portion of at least 80% of the inclined face excluding the top and bottom ends thereof although there are variations of about ±5 degrees. By inclining the end face of the trench-periphery portion 132B, an increase in the virtual aspect ratio of the trench 102a after the formation of the gate insulating film 103 can be prevented or reduced. Accordingly, embedding of the conductive film 105A can be facilitated. In this way, it is possible to increase the cross-sectional area of the gate electrode 105 while preventing or reducing an increase in source-gate capacitance, and thus prevent or reduce an increase in gate resistance.

It is preferable that the interface between the second insulating film 132 and the gate electrode 105 at the bottom of the trench 102a be located below the interface between the drift region 121 and the body region 123. Having this configuration, it is ensured that the second insulating film 132 is not formed on the portion of the body region 123 exposed to the side of the trench 102a, which is to be the channel region. Therefore, there is little possibility that the thick second insulating film may have an influence on the threshold voltage, etc.

Figure 11:
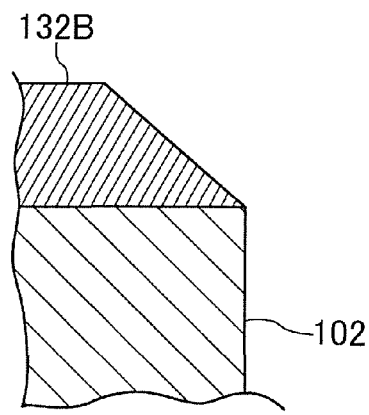
FIGS. 11(a)-11(c) are cross-sectional views showing a first alteration of the fabrication process for the semiconductor device of the embodiment.
Figure 11:
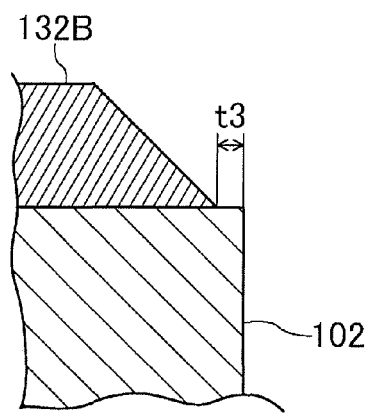
Figure 11:
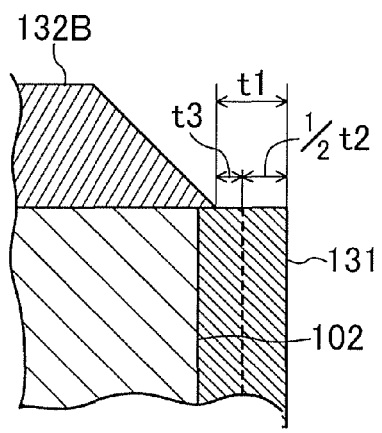

During the deposition of the second insulating film 132, the side of the trench 102a is exposed to the material gas for HDP-CVD. This may cause a change in the state of the side of the trench 102a. Also, depending on the conditions of the HDP-CVD method, part of the second insulating film 132 may be deposited on the side of the trench 102a. In such a case, the second insulating film 132 formed on the side of the trench 102a will be sufficiently thin compared with the inner-trench portion 132A and the trench-periphery portion 132B of the second insulating film 132. Therefore, after the deposition of the second insulating film 132 on the semiconductor 102 as shown in FIG. 11(a), or after densifying of the second insulating film 132, the second insulating film 132 may be wet-etched. FIGS. 11(a) to 11(c) are cross-sectional views showing a first alteration of the fabrication process for a semiconductor device of the embodiment. By wet-etching the second insulating film 132, a portion of the side of the trench 102a denatured by the material gas for HDP-CVD or an SiO₂ film thinly formed on the side of the trench 102a by HDP-CVD can be removed. Thirty percent or less of the thickness of the second insulating film 132 will be enough as the etching amount of the second insulating film 132.

By the wet etching, as shown in FIG. 11(b), the end of the trench-periphery portion 132B of the second insulating film 132 recedes from the edge of the trench 102a by t3. Therefore, once the first insulating film 131 is formed, as shown in FIG. 11(c), the spacing t1 between the end of the trench-periphery portion 132B and the top edge of the trench 102a, i.e., the portion of the first insulating film 131 corresponding to the trench top edge will be larger than a half of the thickness t2 of the top end portion of the first insulating film 131.

Even if the receding amount of the second insulating film 132 is large, the first insulating film 131 is to be formed after exposure of the surface of the semiconductor layer 102. Therefore, exposure of the semiconductor layer 102 is avoided. With the receding amount being 30% or less of the thickness of the second insulating film 132, the area of the receding region is small, little causing an increase in source-gate capacitance.

With the end of the trench-periphery portion 132B having receded by the wet etching, the virtual aspect ratio of the trench 102a at the time of embedding of the conductive film 105A becomes small, providing an advantage of further facilitating embedding of the conductive film 105A.

Figure 12:
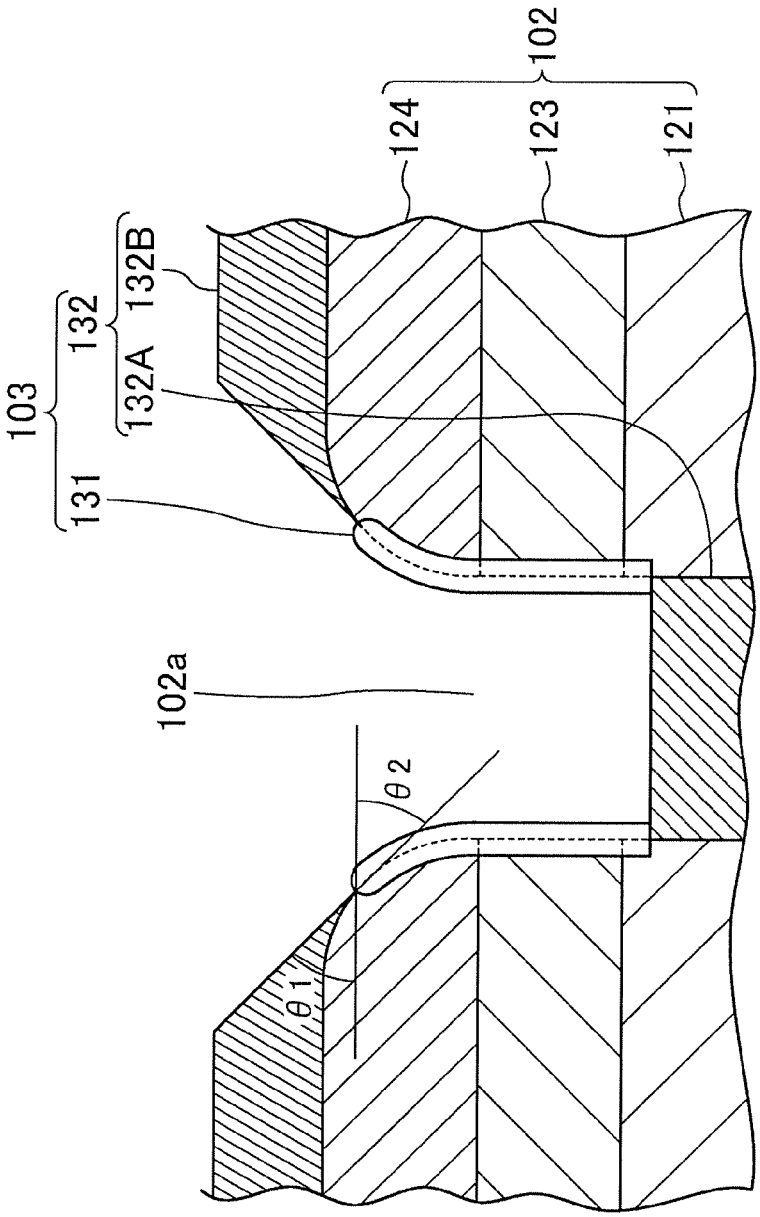
FIG. 12 is an enlarged cross-sectional view showing a second alteration of the semiconductor device of the embodiment.

FIG. 5 shows the case that the top end portion of the trench 102a is approximately square. However, as shown in FIG. 12, the top end portion of the trench 102a may be rounded to have a curved surface. FIG. 12 is an enlarged cross-sectional view showing a second alteration of the semiconductor device of the embodiment. By rounding the top end portion of the trench 102a, the field concentration in the top end portion of the trench 102a can be lessened.

The top end portion of the trench 102a can be rounded by performing the etching for formation of the trench 102a starting the etching under conditions with which the deposition amount will increase and making an arrangement to gradually decrease the deposition amount. Otherwise, the top end portion can be rounded by forming the trench 102a having a square edge under normal etching conditions and then performing annealing under a hydrogen atmosphere to round the top end portion. Not only the top end portion of the trench 102a, but also the bottom end portion thereof may be curved, whereby the field concentration in the bottom end portion of the trench 102a can be lessened.

In formation of the second insulating film 132 by the HDP-CVD method, the trench-periphery portion 132B is to be formed on a portion of the top end portion of the trench 102a of which the inclination is about 45 degrees or less. Therefore, when an upper portion of the trench 102a is curved, the inclination θ2 of the top end portion of the trench 102a in contact with the end of the trench-periphery portion 132B corresponds with the inclination θ1 of the inclined portion of the trench-periphery portion 132B before formation of the first insulating film 131.

Figure 13:
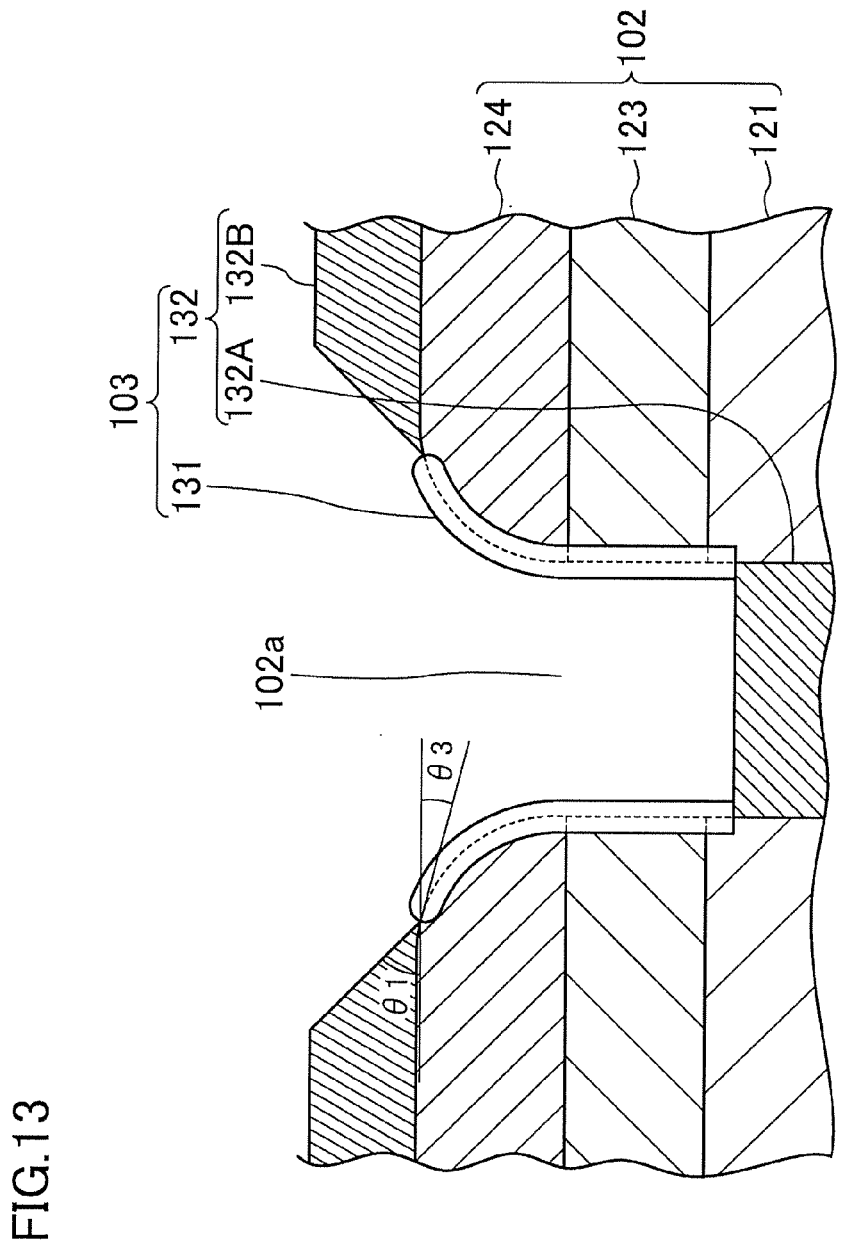
FIG. 13 is an enlarged cross-sectional view showing a third alteration of the semiconductor device of the embodiment.

When the side of the trench 102a is wet-etched after formation of the second insulating film 132, the end of the trench-periphery portion 132B recedes from the edge of the trench 102a. Therefore, as shown in FIG. 13, the inclination θ3 of the top end portion of the trench 102a in contact with the end of the trench-periphery portion 132B is smaller than the inclination θ1 of the inclined portion of the trench-periphery portion 132B before formation of the first insulating film 131. FIG. 13 is an enlarged cross-sectional view of a third alteration of the semiconductor device of the embodiment. In this case, the virtual aspect ratio of the trench 102a at the time of embedding of the conductive film 105A becomes small, and this further facilitates embedding of the conductive film 105A.

Figure 14:
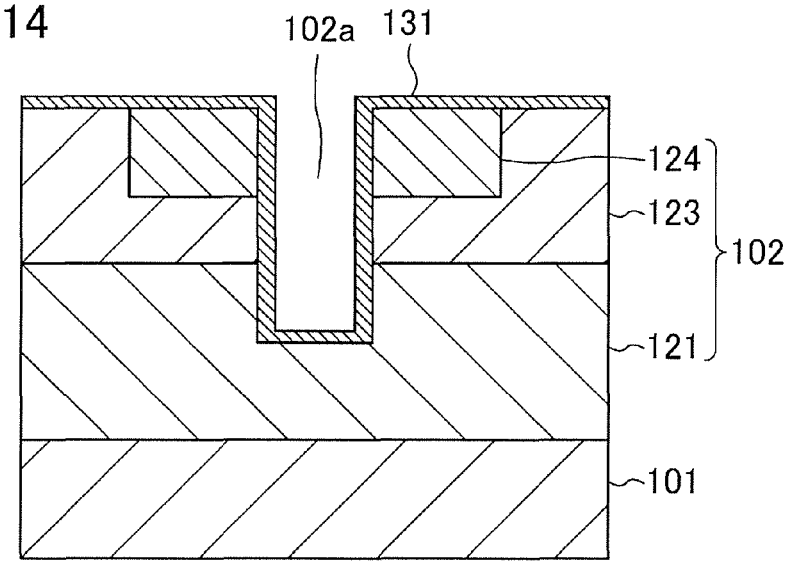
FIG. 14 is a cross-sectional view showing a fourth alteration of the fabrication process for the semiconductor device of the embodiment.
Figure 15:
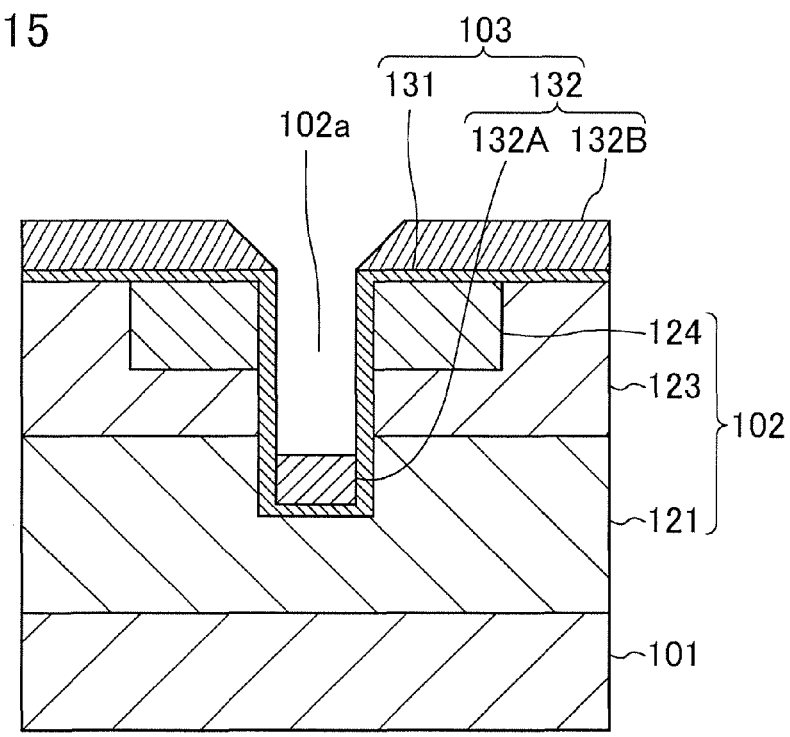
FIG. 15 is a cross-sectional view showing the fourth alteration of the fabrication process for the semiconductor device of the embodiment.
Figure 16:
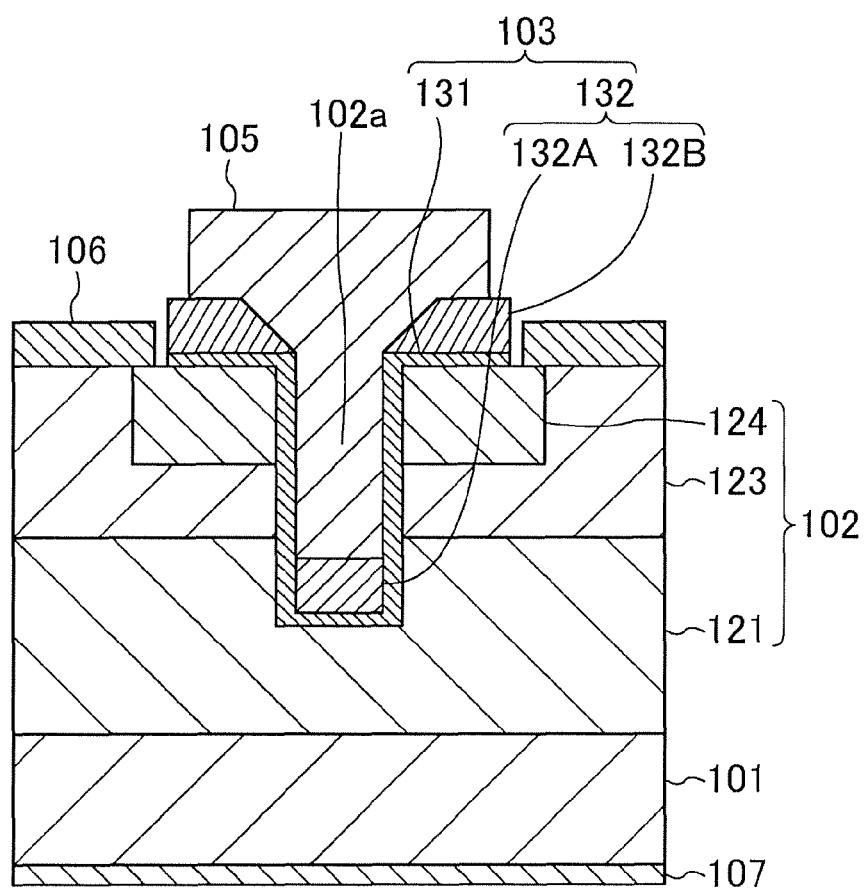
FIG. 16 is a cross-sectional view showing the fourth alteration of the fabrication process for the semiconductor device of the embodiment.

In this embodiment, described was the example of forming the first insulating film 131 after formation of the second insulating film 132. The formation of the first insulating film 131 after formation of the second insulating film 132 provides an advantage that the first insulating film 131 is free from degradation in film quality that may otherwise occur if the first insulating film 131 is exposed to high-density plasma. This also provides an advantage that the thickness of the first insulating film 131 will not be reduced by high-density plasma. However, the first insulating film 131 may be formed first before formation of the second insulating film 132. FIGS. 14 to 16 are cross-sectional views showing a fourth alteration of the fabrication process for a semiconductor device of the embodiment. An SiO₂ film formed by the HDP-CVD method is more likely to cause generation of fixed charge, etc. at the interface with the semiconductor layer than an SiO₂ film formed by the thermal oxidation method. By forming the first insulating film 131 by the thermal oxidation method prior to formation of the second insulating film 132, it is possible to obtain an advantage that generation of fixed charge at the interface between the gate insulating film 103 and the semiconductor layer 102 can be prevented or reduced.

In this alteration, as shown in FIG. 14, after formation of the trench 102a, thermal oxidation is performed before formation of the second insulating film 132, to form the first insulating film 131 on the exposed portion of the semiconductor layer 102. Thereafter, as shown in FIG. 15, the second insulating film 132 is formed on the bottom of the trench 102a and the periphery thereof by the HDP-CVD method. Then, as in the case of forming the second insulating film 132 before the first insulating film 131, formation of the gate electrode 105, formation of the source electrode 106, formation of the drain electrode 107, etc. may be performed.

Figure 17:
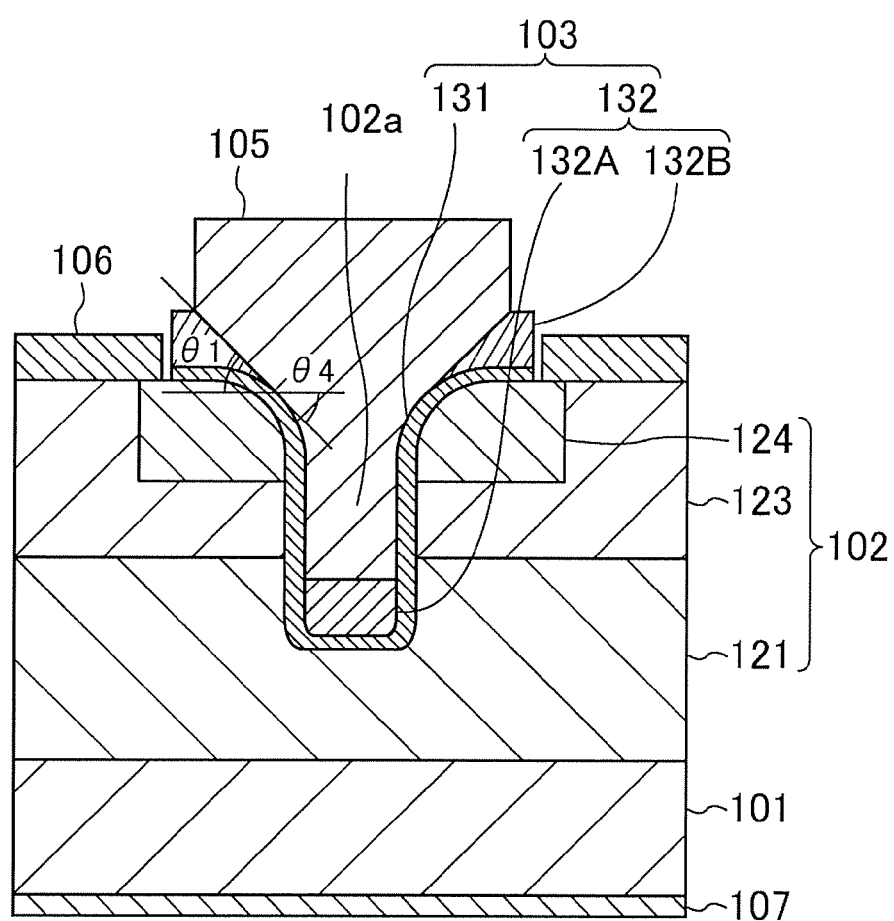
FIG. 17 is a cross-sectional view showing a fifth alteration of the semiconductor device of the embodiment.

In the case of forming the first insulating film 131 before the second insulating film 132, as shown in FIG. 16, the position of the end of the trench-periphery portion 132B of the second insulating film 132 corresponds with the top edge of the trench 102a after formation of the first insulating film 131. In other words, the position of the end of the trench-periphery portion 132B and the position of the portion of the first insulating film 131 corresponding to the top edge of the trench 102a correspond with each other. The formation of the first insulating film 131 before the second insulating film 132 can also be applied even when the top end portion of the trench 102a is rounded. FIG. 17 is a cross-sectional view showing a fifth alteration of the semiconductor device of the embodiment. In this case, as shown in FIG. 17, the inclination θ4 of a portion of the trench 102a having the first insulating film 131 formed thereon that is in contact with the end of the trench-periphery portion 132B corresponds with the inclination θ1 of the inclined portion of the trench-periphery portion 132B.

Figure 18:
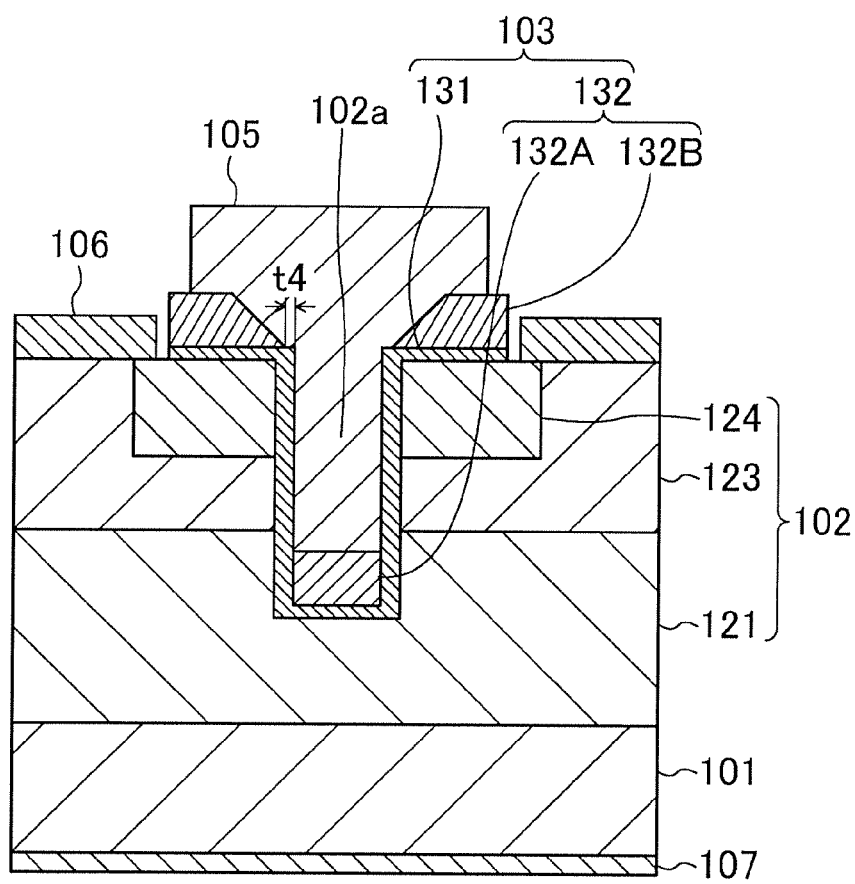
FIG. 18 is a cross-sectional view showing a sixth alteration of the semiconductor device of the embodiment.

In the case of forming the first insulating film 131 before the second insulating film 132, also, wet etching may be performed after formation of the second insulating film 132. By performing wet etching, it is ensured to expose the first insulating film 131 on the side of the trench 102a, to bring the first insulating film 131 into contact with the gate electrode 105 on the side of the trench 102a. FIG. 18 is a cross-sectional view showing a sixth alteration of the semiconductor device of the embodiment. When the second insulating film 132 is wet-etched, as shown in FIG. 18, the end of the trench-periphery portion 132B recedes from the top edge of the trench 102a after formation of the first insulating film 131 by t4. The receding amount t4 of the trench-periphery portion 132B approximately corresponds with the etching amount of the second insulating film 132. Thirty percent or less of the thickness of the second insulating film 132 will be enough as the etching amount of the second insulating film 132. In addition, in this case, since the first insulating film 131 has been formed also on the periphery of the trench 102a, there will be little influence on the gate capacitance as far as the receding amount t4 is about 100 nm or less.

Figure 19:
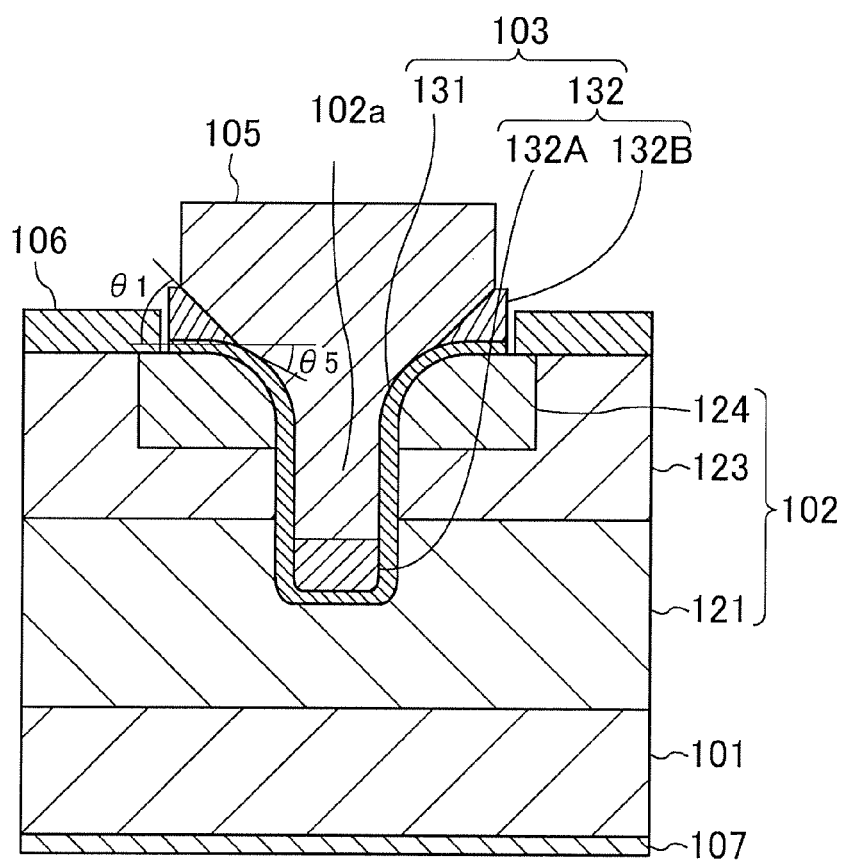
FIG. 19 is a cross-sectional view showing a seventh alteration of the semiconductor device of the embodiment.

Moreover, as shown in FIG. 19, wet etching of the second insulating film 132 may be performed even when the top end portion of the trench 102a is rounded. FIG. 19 is a cross-sectional view showing a seventh alteration of the semiconductor device of the embodiment. In this case, the inclination θ5 of a portion of the trench 102a having the first insulating film 131 formed thereon that is in contact with the end of the trench-periphery portion 132B is smaller than the inclination θ1 of the inclined portion of the trench-periphery portion 132B.

The thickness of the first insulating film 131 changes with the plane direction of the semiconductor layer 102. When the semiconductor layer 102 is formed on the substrate 101 having the (0001) Si plane as the principal surface, the thickness of the portions of the first insulating film 131 formed on the top surface of the semiconductor layer 102 and the bottom of the trench 102a is smaller than the thickness of the portion thereof formed on the side of the trench 102a. However, the thin first insulating film 131 will cause no problem because the second insulating film 132 is to be formed on the bottom of the trench 102a and the periphery thereof.

While the n-type MISFET was described in this embodiment, a p-type MISFET can also be formed. In this case, the conductivity type of the substrate 101, the drift region 121, and the source region 124 may be changed to the p-type and that of the body region 123 to the n-type. Also, the semiconductor layer 102 may have a region other than the drift region 121, the body region 123, and the source region 124. For example, for reducing the electric field, an impurity layer having a conductivity type different from the drift region 121 may be provided near the bottom of the trench 102a.

Figure 20:
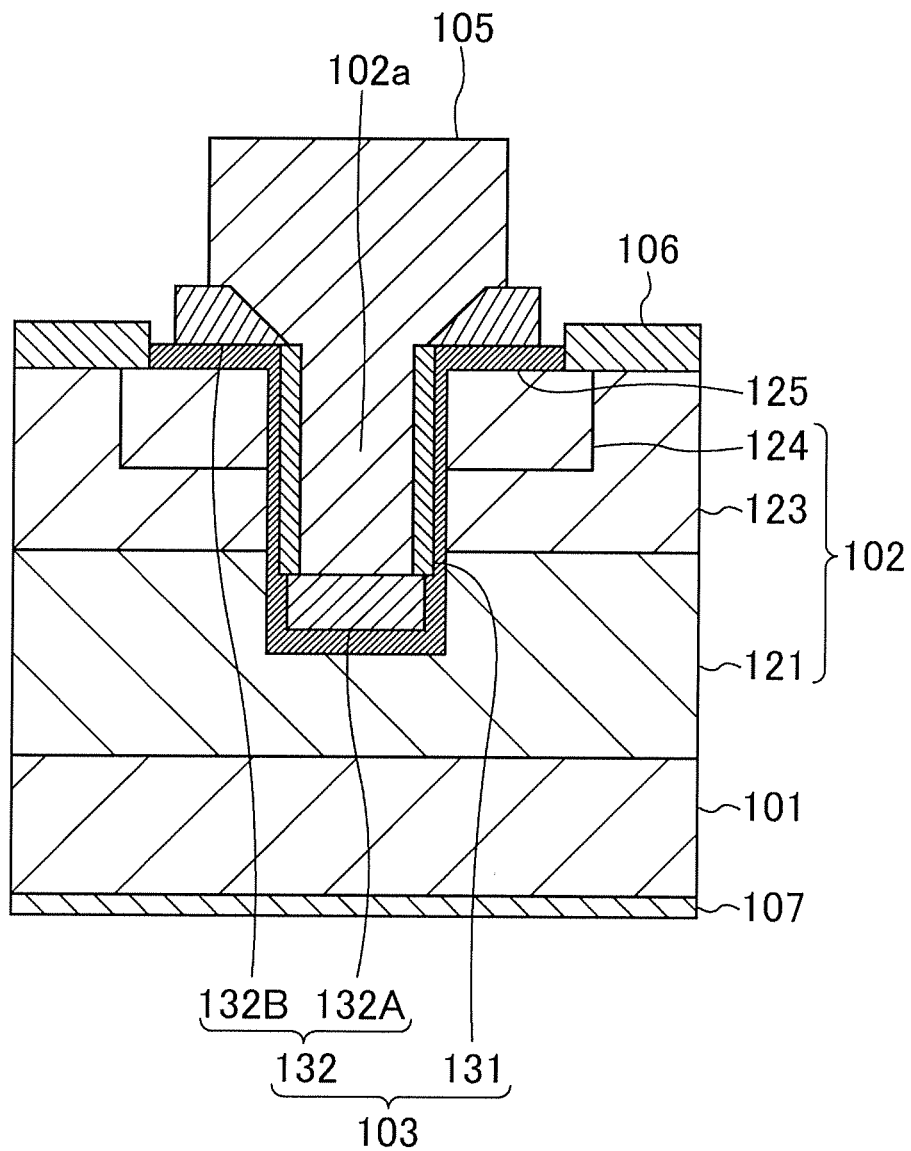
FIG. 20 is a cross-sectional view showing an eighth alteration of the semiconductor device of the embodiment.

While the MISFET having an inverted channel structure was described in this embodiment, a similar configuration can also be used for a MISFET having a stored channel structure as shown in FIG. 20. FIG. 20 is a cross-sectional view showing an eighth alteration of the semiconductor device of the embodiment. For example, after formation of the trench 102a in the semiconductor layer 102, a channel layer 125 made of an n-type SiC layer may be formed on the semiconductor layer 102 including the inside of the trench 102a. After formation of the channel layer 125, the gate insulating film 103, the gate electrode 105, the source electrode 106, the drain electrode 107, etc. may be formed as in the case of the MISFET having the inverted channel structure. While the example of forming the first insulating film 131 after the second insulating film 132 was shown in FIG. 20, the first insulating film 131 may be formed before the second insulating film 132. In the case of the stored channel structure, also, wet etching may be performed after formation of the second insulating film 132, and a top portion of the trench 102a may be rounded. Also, a p-type MISFET may be formed.

Furthermore, not only the MISFETs, but various types of semiconductor devices that have an electrode placed on a semiconductor layer via an insulating film can be fabricated in a similar manner. For example, an insulated gate bipolar transistor (IGBT) can be formed by imparting different conductivity types to the substrate and the semiconductor layer directly formed thereon.

While the example of a plurality of unit cells arranged in a zigzag fashion was described in this embodiment, the unit cells may be arranged in any fashion. Also, while the example of the trench having a square planar shape was described, the trench may have any planar shape. For example, the trench may have a rectangular planar shape, and the unit cells may be arranged so that the major sides of a plurality of trenches extend in parallel with each other.

In this embodiment, the example of the substrate 101 being made of 4H—SiC and the semiconductor layer 102 being formed on the (0001) Si plane was described. Alternatively, the semiconductor layer 102 may be formed on a (000-1) C plane and the drain electrode 107 may be formed on the (0001) Si plane. Otherwise, the plane direction of the principal surface may be of another crystal plane. Further, another polytype SiC substrate may be used.

While the semiconductor device using SiC was described in this embodiment, the present disclosure is also applicable to a semiconductor device using another wide band-gap semiconductor such as gallium nitride (GaN) and diamond. Also, the present disclosure is applicable to a semiconductor device using silicon.

INDUSTRIAL APPLICABILITY

The semiconductor device and the fabrication method for the same of the present disclosure are useful as various types of semiconductor devices including power devices and fabrication methods for the same.

DESCRIPTION OF REFERENCE CHARACTERS

11 Unit Cell
101 Substrate
102 Semiconductor Layer
102a Trench
103 Gate Insulating Film
105 Gate Electrode
105A Conductive Film
106 Source Electrode
107 Drain Electrode
121 Drift Region
123 Body Region
124 Source Region
125 Channel Layer
131 First Insulating Film
132 Second Insulating Film
132A Inner-Trench Portion
132B Trench-Periphery Portion
141 Resist Layer

The invention claimed is:

1. A fabrication method for a semiconductor device, comprising the steps of:
   preparing a substrate having a semiconductor layer provided on a principal surface;
   forming a trench in the semiconductor layer;
   forming a gate insulating film on a side of the trench, a bottom of the trench, and a periphery of the trench; and
   forming a conductive film on the gate insulating film to fill the trench and extend on the periphery of the trench, wherein
   the step of forming a gate insulating film includes a step of forming a first insulating film on the side of the trench and a step of forming a second insulating film on the bottom of the trench and the periphery of the trench using a high-density plasma chemical vapor deposition method, the thickness of portions of the gate insulating film formed on the bottom of the trench and the periphery of the trench being made larger than a thickness of a portion of the gate insulating film formed on the side of the trench,
   in the step of forming a conductive film, the conductive film is formed to be in contact with a portion of the first insulating film formed on the side of the trench,
   in the step of preparing a substrate, the semiconductor layer is formed to include a drift region of a first conductivity type and a body region of a second conductivity type provided on the drift region,
   in the step of forming a trench, the trench is formed so that the bottom of the trench is located below an interface between the drift region and the body region and above a bottom of the drift region, and
   in the step of forming a gate insulating film, the gate insulating film is formed so that a top surface of the portion thereof formed on the bottom of the trench is located below the interface between the drift region and the body region.

2. The fabrication method for a semiconductor device of claim 1, wherein
   the step of forming a first insulating film is performed after the step of forming a second insulating film.

3. The fabrication method for a semiconductor device of claim 1, wherein
   the step of forming a first insulating film is performed before the step of forming a second insulating film.

4. The fabrication method for a semiconductor device of claim 1, wherein
   the step of forming a trench includes a step of rounding a top end portion of the trench.

5. The fabrication method for a semiconductor device of claim 1, further comprising the step of:
   wet-etching the second insulating film before the step of forming a conductive film,
   wherein an etching amount of the second insulating film is 30% or less of a thickness of the second insulating film.

6. The fabrication method for a semiconductor device of claim 1, wherein
   the semiconductor layer is made of a wide band-gap semiconductor.

7. The fabrication method for a semiconductor device of claim 6, wherein
   the wide band-gap semiconductor is silicon carbide.

8. The fabrication method for a semiconductor device of claim 7, wherein
   the substrate is a silicon carbide substrate, and the principal surface is a silicon plane.

9. A semiconductor device comprising:
   a substrate;
   a semiconductor layer provided on a principal surface of the substrate;
   a trench provided in the semiconductor layer;
   a gate insulating film provided on a side of the trench, a bottom of the trench, and a periphery of the trench; and
   a conductive film provided on the gate insulating film to fill the trench and extend on the periphery of the trench, wherein:
   the gate insulating film has a first insulating film provided on the side of the trench and a second insulating film provided on the bottom of the trench and the periphery of the trench,
   a thickness of portions of the gate insulating film provided on the bottom of the trench and the periphery of the trench is larger than a thickness of a portion of the gate insulating film provided on the side of the trench, a portion of the second insulating film provided on the periphery of the trench has an inclined portion that becomes gradually thicker from the trench-side end, and the inclination angle of the inclined portion with respect to the principal surface of the substrate is 45±5 degrees,
   the conductive film is in contact with a portion of the first insulating film formed on the side of the trench,
   the semiconductor layer includes a drift region of a first conductivity type and a body region of a second conductivity type provided on the drift region,
   the bottom of the trench is located below an interface between the drift region and the body region and above a bottom of the drift region, and
   a top surface of the portion of the gate insulating film formed on the bottom of the trench is located below the interface between the drift region and the body region.

10. The semiconductor device of claim 9, wherein
    the thickness of the portion of the gate insulating film provided on the periphery of the trench is larger than that of the portion of the gate insulating film provided on the bottom of the trench.

11. The semiconductor device of claim 9, wherein the semiconductor layer is made of a wide band-gap semiconductor.

12. The semiconductor device of claim 11, wherein the wide band-gap semiconductor is silicon carbide.

13. The semiconductor device of claim 12, wherein the substrate is a silicon carbide substrate, and the principal surface is a silicon surface.

14. The semiconductor device of claim 9, wherein the first insulating film is formed on the side of the trench and the bottom and periphery of the trench.

15. The semiconductor device of claim 14, wherein a position of the trench-side end of the portion of the second insulating film provided on the periphery of the trench corresponds with a position of a portion of the first insulating film corresponding to a top edge of the trench.

16. The semiconductor device of claim 14, wherein a space between the trench-side end of the portion of the second insulating film provided on the periphery of the trench and a portion of the first insulating film corresponding to a top edge of the trench is 30% or less of a thickness of the portion of the second insulating film provided on the periphery of the trench.

17. The semiconductor device of claim 14, wherein a top end portion of the trench is rounded, and an angle of a tangent at a portion of the top end portion of the trench that is in contact with the trench-side end of the second insulating film with respect to a principal surface of the substrate is the same as the inclination angle of the inclined portion.

18. The semiconductor device of claim 14, wherein a top end portion of the trench is rounded, and an angle of a tangent at a portion of the top end portion of the trench that is in contact with the trench-side end of the second insulating film with respect to a principal surface of the substrate is smaller than the inclination angle of the inclined portion.

* * * * *